US011306824B2

(12) United States Patent
Riordon et al.

(10) Patent No.: US 11,306,824 B2
(45) Date of Patent: Apr. 19, 2022

(54) DUAL PORT REMOTE PLASMA CLEAN ISOLATION VALVE

(71) Applicant: Applied Materials, Inc., Santa Clara, CA (US)

(72) Inventors: Benjamin B. Riordon, Newburyport, MA (US); Charles T. Carlson, Austin, TX (US); Aaron Webb, Austin, TX (US); Gary Wyka, Cedar Park, TX (US)

(73) Assignee: Applied Materials, Inc., Santa Clara, CA (US)

( * ) Notice: Subject to any disclaimer, the term of this patent is extended or adjusted under 35 U.S.C. 154(b) by 53 days.

(21) Appl. No.: 16/642,827

(22) PCT Filed: Sep. 28, 2018

(86) PCT No.: PCT/US2018/053403
§ 371 (c)(1),
(2) Date: Feb. 27, 2020

(87) PCT Pub. No.: WO2019/067885
PCT Pub. Date: Apr. 4, 2019

(65) Prior Publication Data
US 2020/0217423 A1    Jul. 9, 2020

Related U.S. Application Data

(60) Provisional application No. 62/565,915, filed on Sep. 29, 2017.

(51) Int. Cl.
*F16K 1/20* (2006.01)
*F16K 49/00* (2006.01)
(Continued)

(52) U.S. Cl.
CPC .......... *F16K 1/2021* (2013.01); *F16K 49/005* (2013.01); *F16K 51/02* (2013.01);
(Continued)

(58) Field of Classification Search
CPC .......... F16K 1/20; F16K 1/2021; F16K 1/223; F16K 11/10; F16K 27/0209;
(Continued)

(56) References Cited

U.S. PATENT DOCUMENTS 3,074,427 A *  1/1963  Wheeler, Jr. ............ F16K 1/223
                                                137/512.1
4,085,764 A *  4/1978  Raidl, Jr. ................ F16K 17/16
                                                    137/312
(Continued)

OTHER PUBLICATIONS

International Search Report and Written Opinion for International Application No. PCT/US2018/053403 dated Feb. 1, 2019.

*Primary Examiner* — Craig J Price
(74) *Attorney, Agent, or Firm* — Patterson + Sheridan, LLP (57) ABSTRACT

The present disclosure generally relates to an isolation device for use in processing systems. The isolation device has a body with an inlet opening disposed at a first end coupled to a processing system component such as a remote plasma source and outlet openings, for example two, disposed at a second end which are coupled to a processing system component such as a process chamber. Flaps disposed within the body are actuatable to an open position from a closed position or to a closed position from an open position, to selectively allow or prevent passage of a fluid from the processing system component coupled to the isolation device to the other processing system component coupled thereto.

18 Claims, 5 Drawing Sheets

(51) Int. Cl.
*F16K 51/02* (2006.01)
*H01J 37/32* (2006.01)

(52) U.S. Cl.
CPC ...... *H01J 37/32357* (2013.01); *F16K 1/2057* (2013.01); *Y10T 137/6028* (2015.04)

(58) Field of Classification Search
CPC ............. F16K 27/0218; F16K 27/0227; F16K 31/52441; F16K 39/028; F16K 49/005; F16K 51/02; F16K 1/16; F16K 1/18; F16K 1/2042; F16K 1/205; F16K 1/2057; Y10T 137/0491; Y10T 137/0525; Y10T 137/0402; Y10T 137/6028; Y10T 137/88022; Y10T 137/8803; Y10T 137/88038; Y10T 137/88046; Y10T 137/88054; Y10T 137/88062; H01J 37/3244; H01J 37/32449; H01J 37/32357; H01J 37/32862
USPC ................................ 137/614.16–614.21, 887
See application file for complete search history.

(56) References Cited

U.S. PATENT DOCUMENTS

| | | | |
|---|---|---|---|
| 4,977,855 A * | 12/1990 | Ohmi | C23C 16/455 118/722 |
| 5,002,793 A * | 3/1991 | Arai | C23C 16/452 118/626 |
| 5,611,863 A * | 3/1997 | Miyagi | H01J 37/32192 118/723 MP |
| 7,699,935 B2 * | 4/2010 | Sankarakrishnan | F16K 1/221 134/1.1 |
| 8,007,473 B2 * | 8/2011 | Smith | A61B 17/3462 604/167.04 |
| 9,818,601 B1 * | 11/2017 | Tokunaga | H01L 21/02164 |
| 2005/0121088 A1 | 6/2005 | Dando et al. | |
| 2007/0284119 A1 | 12/2007 | Jackson et al. | |
| 2009/0259186 A1 * | 10/2009 | Smith | A61B 17/3462 604/167.04 |
| 2011/0006240 A1 | 1/2011 | Williams et al. | |
| 2016/0084400 A1 | 3/2016 | Sankarakrishnan et al. | |
| 2017/0162366 A1 | 6/2017 | Yanagisawa | |
| 2017/0292633 A1 * | 10/2017 | Hill | F16K 49/007 |

* cited by examiner

DUAL PORT REMOTE PLASMA CLEAN ISOLATION VALVE

BACKGROUND

Field

Embodiments of the present disclosure generally relate to an isolation device for use in a processing system.

Description of the Related Art

In manufacturing of microelectronic devices such as semiconductor devices, remote plasma sources are used to provide gas radicals, gas ions, or both to a process chamber in which a process is being carried out on a substrate. The remote plasma source is generally connected to the process chamber through a port disposed through the body of the process chamber. In order to isolate the remote plasma source from the process chamber, an isolation device, such as a valve, is disposed between the remote plasma source and the process chamber. During operations utilizing the remote plasma source to supply gas radicals, gas ions, or both into the processing volume of the process chamber, the isolation device is moved to an open position to allow fluid communication between the processing volume of the process chamber and the remote plasma source. After completion of the processing operation, the isolation device is moved to a closed position, thus isolating the remote plasma source from the processing volume of the process chamber.

Conventional remote plasma source isolation devices, where a simple valve is utilized in a flowline between the remote plasma source and the port, often suffer from degradation of the sealing mechanism thereof due to exposure of the sealing mechanism to the gas radicals, gas ions, or both from the remote plasma source, or from exposure to the a process chemistry in the processing volume of the process chamber. As a result, frequent maintenance is needed to repair or replace the sealing mechanism to maintain functionality. These maintenance operations often involve lengthy outages of the process chamber resulting in reduced utilization of the process chamber.

Therefore, what is needed is an improved remote plasma source isolation device and methods of operating the same.

SUMMARY

The present disclosure generally relates to an isolation device for use in processing systems.

In one embodiment, an isolation device is provided. The isolation device has a body with an inlet opening at a first end and one or more outlet openings at a second end. An isolation volume is defined in the body. A first flap and a second flap are disposed in the isolation volume. The first flap and the second flap are pivotally actuated to selectively allow access to and block access to at least one of the inlet opening or the one or more outlet openings.

In another embodiment, a system for processing a substrate is provided. The system includes a remote plasma source, one or more process chambers fluidly coupled to the remote plasma source, and an isolation device disposed between the remote plasma source and the one or more process chambers. The isolation device has a body with an inlet opening and at least two outlet openings. An isolation volume is defined in the body in which a first flap and a second flap are disposed. The first flap and the second flap are pivotally actuated to selectively allow access to, and block access to, at least one of the inlet opening or outlet openings.

In yet another embodiment, a method for processing a substrate is provided. The method includes blocking fluid communication between a remote plasma source and a process chamber with an isolation device. The blocking includes the operations of: moving a first flap of the isolation device to a first position blocking access to a first port disposed in a first end of the isolation device, and moving a second flap of the isolation device to a second position blocking access to a second port disposed in a second end of the isolation device.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The embodiments described herein relate to an isolation device for isolating chambers within a processing system from a flow line. The isolation device comprises a body having an inlet opening disposed at a first end coupled to a processing system component such as a remote plasma source and outlet openings, for example two, disposed at a second end which are coupled to a processing system component such as a process chamber. Flaps disposed within the body are actuatable to an open position from a closed position or to a closed position from an open position, to selectively allow or prevent passage of a fluid from the processing system component coupled to the isolation device to the other processing system component coupled thereto.

Figure 1:
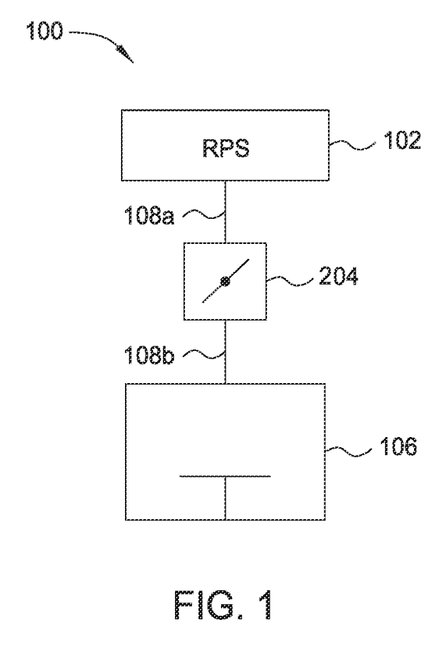
FIG. 1 is schematic arrangement of a processing apparatus utilizing a remote plasma source.

FIG. 1 is a schematic arrangement of an exemplary processing apparatus utilizing a remote plasma source. In FIG. 1, a processing apparatus 100 has a remote plasma source 102 coupled to a process chamber 106 by conduits 108a, 108b. An isolation device 204, such as a valve, is disposed between the remote plasma source 102 and the process chamber 106. The isolation device 204 is in fluid communication with the remote plasma source 102 and the process chamber 106 through conduits 108a, 108b. During processing operations, passage of fluid through the isolation device 204 may be interrupted to isolate the process chamber 106 from the remote plasma source 102. By opening the isolation device 204 to allow fluid to pass therethrough, gas radicals, gas ions, or both generated by the remote plasma source 102 can flow through the conduits 108a, 108b and the isolation device 204 and into the process chamber 106. The exemplary processing apparatus 100 is disclosed for illustrative purposes only. Other configurations or types of process chambers may be utilized with the embodiments described herein.

Figure 2:
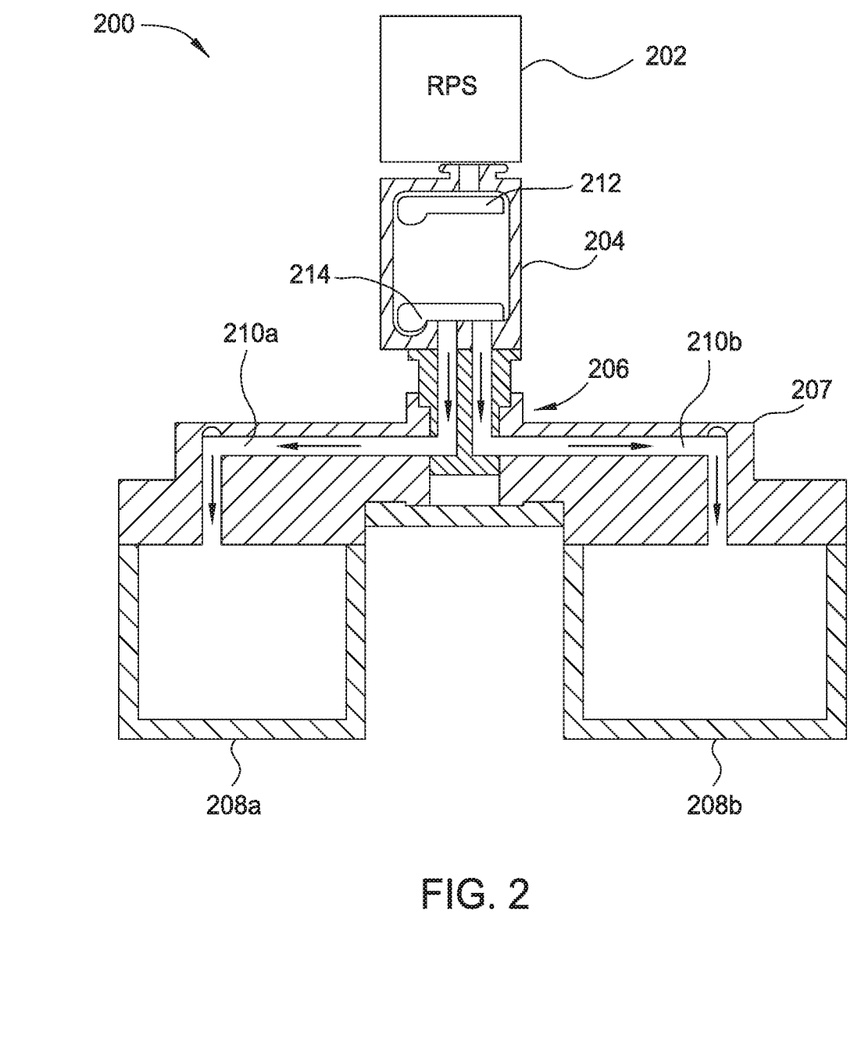
FIG. 2 is a cross-section schematic of an exemplary dual chamber processing system.

FIG. 2 is an exemplary dual chamber substrate processing system 200. The processing system 200 has a remote plasma source 202, an isolation device 204, a chamber lid 207 coupled to the isolation device 204 by a flange 206, and process chambers 208a, 208b. The remote plasma source 202 is coupled to the isolation device 204, which is further coupled to the chamber lid 207. Gas conduits 210a, 210b are disposed within the chamber lid 207 and enable fluid communication between the isolation device 204 and the process chambers 208a, 208b. The isolation device 204 includes flaps 212 and 214. In FIG. 2, the isolation device 204 is shown, in cross-section, in the closed position. The isolation device 204 will be discussed in detail below.

Figure 3A:
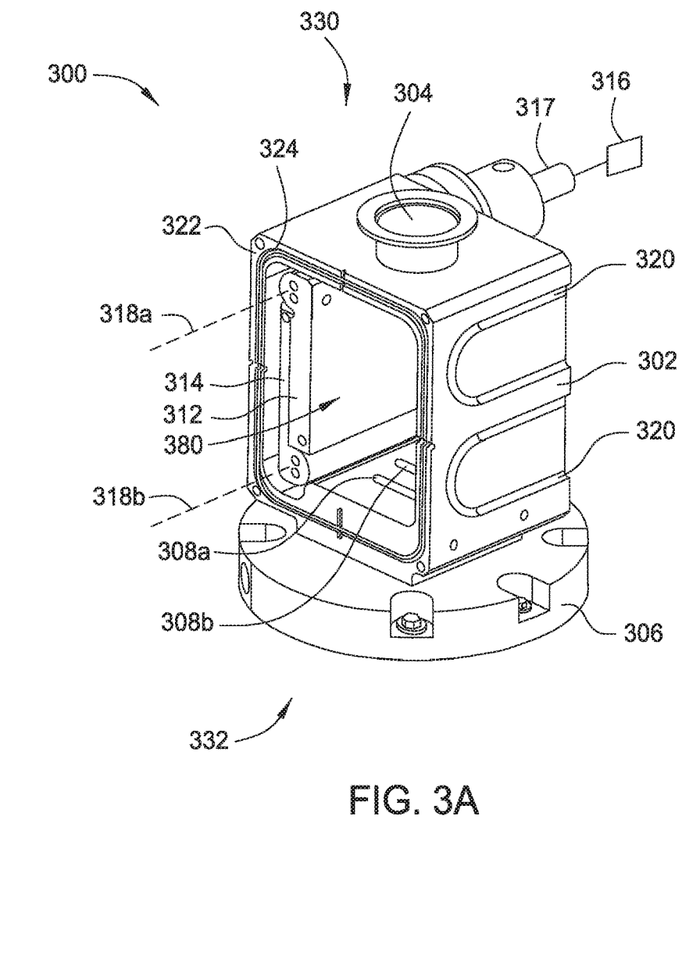
FIG. 3A is an isometric view of an isolation device according to certain embodiments.
Figure 3B:
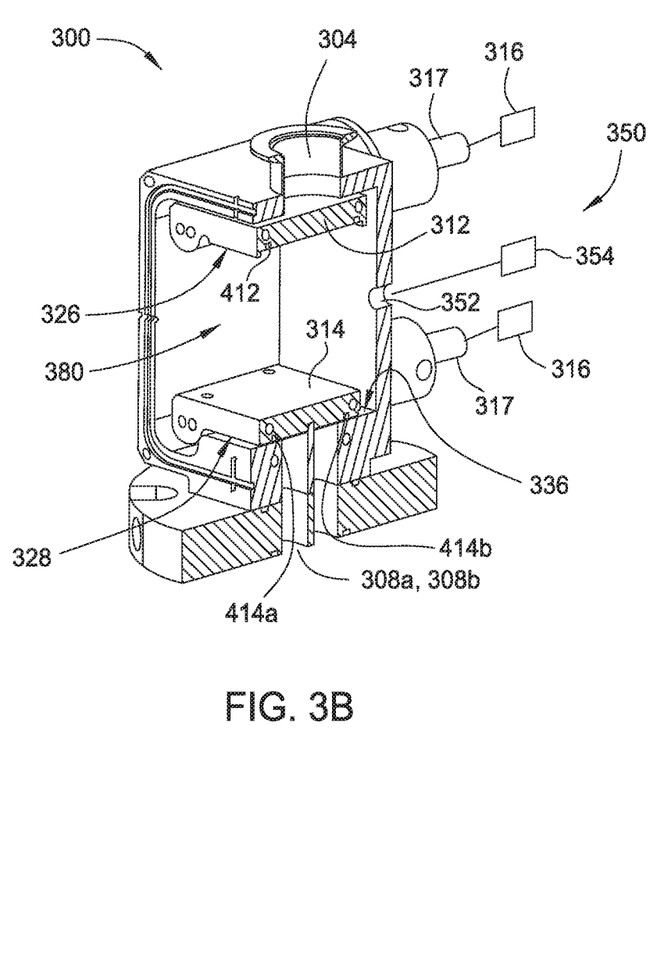
FIG. 3B is an isometric cross-section of the isolation device of FIG. 3A.

FIGS. 3A and 3B are cross-sectional perspective views of an isolation device 300 according to certain embodiments. The isolation device 300 in FIGS. 3A and 3B is a flap style valve. The isolation device 300 has a body 302 with a first end 330 and a second end 332 opposite the first end 330. An inlet port 304 is disposed through the body 302 at the first end 330. Outlet ports 308a, 308b are disposed through the body at the second end 332. The outlet ports 308a, 308b are disposed opposite the inlet port 304. The inlet port 304 is coupled to a remote plasma source, such as the remote plasma source 202 illustrated in FIG. 2. The outlet ports 308a, 308b extend parallel and adjacent to each other through the body 302 and a base flange 306. The base flange 306 is coupled to the second end 332 of the isolation device 300. In one embodiment, the base flange 306 couples the isolation device 300 to a common chamber lid, such as the chamber lid 207 illustrated in FIG. 2. It is understood that the base flange 306 is an exemplary attachment method. Other methods of attaching the isolation device 300 to the common chamber lid may be practiced herewith so the isolation device 300 is removable from the chamber lid. The isolation device 300 may be removed from the chamber lid to facilitate maintenance or replacement of the isolation device 300 with another isolation device.

The body 302 of the isolation device illustrated in FIGS. 3A and 3B is generally cuboid and at least partially defines an isolation volume 380 therein. Flaps 312, 314 are hingedly disposed in the isolation volume 380. In FIGS. 3A and 3B, two flaps 312, 314 are shown but other arrangements, such as three flaps, may be used. The body 302 and the flaps 312, 314 are formed from a metal containing material, such as aluminum or alloys thereof. A maintenance door (not shown) couples to the body 302 at a surface 322. In FIG. 3A, the maintenance door is removed and the flaps 312, 314 are positioned such that the isolation device 300 is in the open position to allow passage of gas radicals, gas ions, or both from the remote plasma source through the isolation volume 380 into downstream process chambers, such as process chambers 208a and 208b illustrated in FIG. 2. In FIG. 3B, the flaps 312, 314 are positioned such that the isolation device 300 is in the closed position. In the closed position, the remote plasma source, and thus gas radicals, gas ions, or both, is isolated from the downstream process chambers.

Seals 412, 414a, and 414b are disposed within seal grooves in the flaps 312, 314. The outer seal 412 is disposed within a seal groove formed in a seal retaining face 326 of the flap 312. The inner seals 414a, 414b are disposed within seal grooves formed in a seal retaining face 328 of the flap 314. When the isolation device 300 is in the closed position, the inner seals 414a, 414b seal against an interior surface 336 of the body 302 and surround the outlet ports 308a, 308b. When the isolation device 300 is in the open position, the seal retaining face 326 of the flap 312, having the outer seal 412 disposed therein, mates to a seal retaining face 328 of the flap 314, to protect the inner seals 414a, 414b disposed in the flap 314 from exposure to the gas radicals, gas ions, or both. In the closed position, the seal retaining face 326 of the flap 312 faces the isolation volume 380. To move the flaps 312, 314 between the open and closed positions, the flaps 312, 314 are axially connected to actuators 316. The actuators 316 individually pivot the flaps 312, 314 about axes 318a, 318b, respectively. The axes 318a, 318b are defined by rotational shafts 317 coupling the flaps 312, 314 to the actuators 316.

One or more cooling channels 320 are disposed within the body 302. The cooling channels 320 allow a temperature control fluid to be circulated within the body 302 to control the temperature of the isolation device 300. The cooling channels 320 may be coupled to heat exchanger system (not shown) in order to maintain a desired temperature of the temperature control fluid. A groove 324 is disposed within the surface 322 of the body 302 facing the maintenance door. An O-ring (not shown) is disposed in the groove 324 to form an air tight seal between the body and the maintenance door. The maintenance door and the body 302 define the isolation volume 380 therein. When the isolation device 300 is in the closed position, as illustrated in FIG. 3B, the isolation volume 380 separates the remote plasma source from downstream process chambers.

A pressure relief system 350 is optionally coupled to the body 302 and in fluid communication with the isolation volume 380. The pressure relief system 350 is useful to balance a pressure across the flaps 312, 314 in the case of a leak into the isolation device 300 from either the downstream process chambers or the remote plasma source. If a pressure difference across a flap 312, 314 becomes too great and a pressure in the isolation volume 380 is higher than a pressure in the inlet port 304 or the outlet ports 308a, 308b when the isolation device 300 is in the closed configuration, the isolation device 300 may become "vapor locked" such that the actuators 316 are not capable to provide enough torque to overcome the force on the flaps 312, 314 caused by the pressure difference.

The pressure relief system 350 includes a port 352 disposed between and in fluid communication with the isolation volume 380 and a relief device 354. The relief device 354 bleeds pressure from the isolation volume 380 enabling the flaps 312, 314 to be moved to the open position. In certain embodiments, the relief device 354 may be a diaphragm valve or a rupture disc, which when ruptured, opens a relief passage between the higher pressure isolation volume 380 and a lower pressure region (not shown). The relief device 354 may be set to open automatically at a set pressure or may be manually opened when necessary.

In order to actuate the isolation device 300 between the open and closed positions, actuators 316 provide rotational motion to the shafts 317 coupled to the flaps 312, 314. In the closed position, the flaps 312, 314 are actuated away from, and to a position generally parallel to, each other. In the closed positions, the flap 314 contacts an inner surface of the body 302 around the outlet ports 308a, 308b and thus seals of the outlet ports 308a, 308b from the isolation volume 380. Meanwhile, flap 312 actuates to cover the inlet port 304 but does not contact an inner surface of the body 302. To change the isolation device 300 to the open position, the flap 314 first swings about the rotational axis 318b into the open position shown in FIG. 3A. The flap 312 then swings about the rotational axis 318a toward the flap 314 such that the seal retaining face of the flap 312, which was facing the isolation volume 380 when the isolation device 300 was in the closed position, now faces the seal retaining face of the flap 314, which was facing a bottom surface of the body 302 through which outlet ports 308a, 308b extend. That is, the seal retaining faces of the flaps 312, 314 face each other and are in contact when the isolation device 300 is in the open position. To close the isolation device 300, the flap 312 swings away from flap 314 towards the inlet port 304 into the closed position thus providing a clear travel path for the flap 314. The flap 314 then swings towards the outlet ports 308a, 308b until the flap 314 contacts the bottom surface of the body 302. The flap movement operations above are described in sequential order. However, it is to be understood that the movement of the flaps 312, 314 may occur as a near simultaneous motion.

Figure 4A:
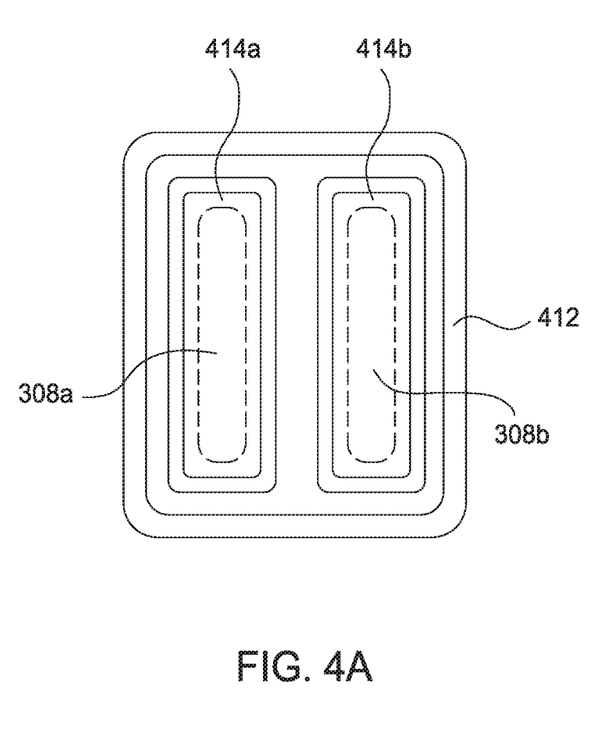
FIG. 4A is a schematic plan view of sealing areas of the isolation device according to certain embodiments.

FIG. 4A is a plan view of sealing areas of the isolation device 300 indicating relative positions of the seals 412, 414a, 414b for flaps 312, 314 when the flaps 312, 314 are in the open position, as illustrated in FIG. 3A.

As shown in FIG. 4A, an outer seal 412 (i.e., a seal with a large circumference) is disposed in a seal groove in the face 326 of the flap 312. In the closed position, the outer seal 412 surrounds two inner seals 414a, 414b which are disposed in grooves formed in the face 328 of the flap 314. The inner seals 414a, 414b each have approximately the same circumference which is smaller than a circumference of the outer seal 412. The inner seals 414a, 414b may be referred to as primary seals. The faces 326, 328 of the flaps 312 and 314, respectively, with seal grooves formed therein, face one another and nest together when the flaps 312, 314 are in the open position. When the isolation device 300 is in the open position, the outer seal 412 seals against the flap 314 and encircles the inner, primary seals 414a, 414b, forming a protective seal around the inner seals 414a, 414b. The outer seal 412 prevents exposure of the inner seals 414a, 414b to gas ions, gas radicals, or both flowing through isolation device 300 from the remote plasma source 202 which can degrade the seals 414a, 414b. Thus, a maintenance interval for replacement of the inner seals 414a, 414b is greatly extended.

Figure 4B:
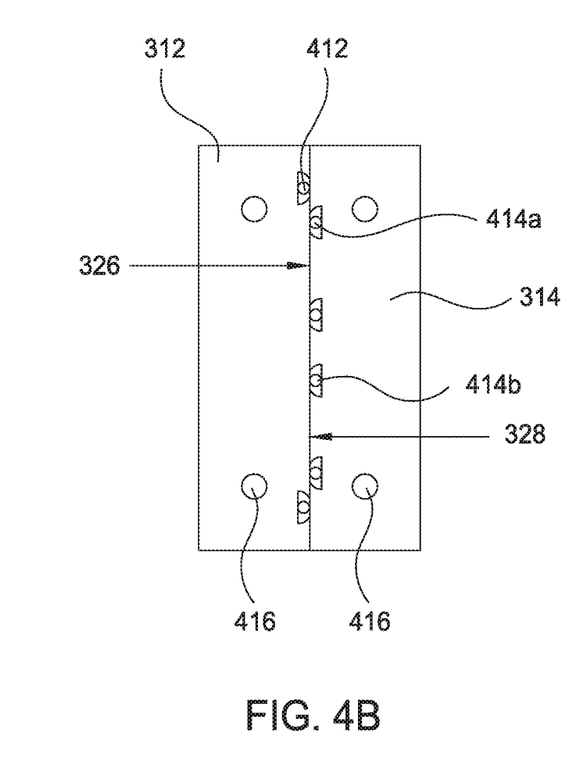
FIG. 4B is a cross-section of isolation device components according to certain embodiments.
Figure 5:
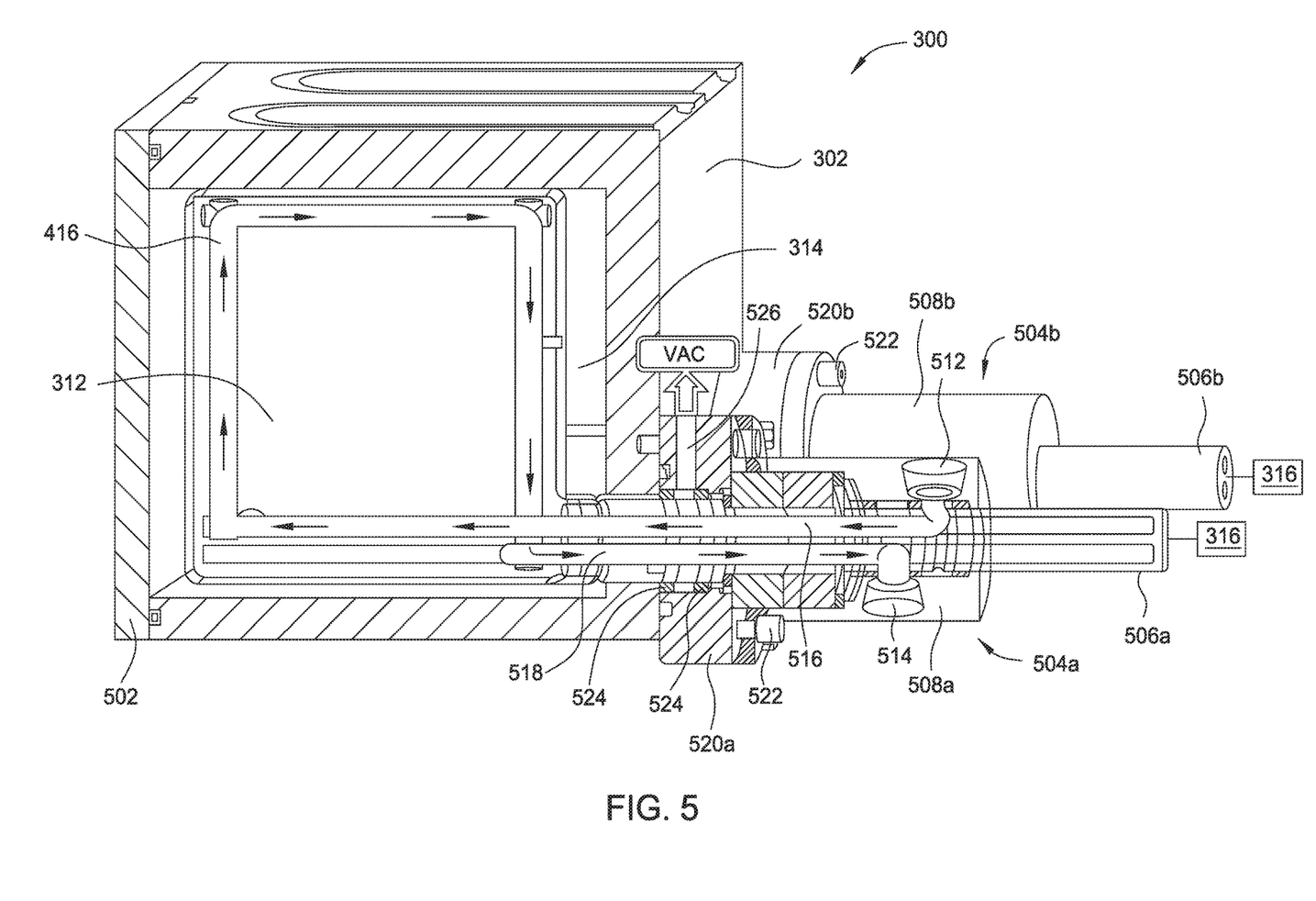
FIG. 5 is an isometric cross-section of an isolation device according to certain embodiments.

FIG. 4B is a cross-section of the flaps 312, 314 in the open position. FIG. 4B shows the outer seal 412 disposed within a groove formed in the flap 312 and disposed outside of the seals 414a, 414b which are disposed within grooves formed in the flap 314. When the isolation device 300 is in the closed position, the inner seals 414a, 414b contact the body 302 adjacent and around the outlet ports 308a, 308b and form seals which encircle the outlet ports 308a, 308b indicated by dashed lines in FIG. 4A. The seals 414a, 414b are larger than the outlet ports 308a, 308b to contact the interior surface 336 of the body 302, as illustrated in FIG. 3B, and surround the outlet ports 308a, 308b to isolate the outlet ports 308a, 308b from the isolation volume 380 illustrated in FIGS. 3A and 3B. FIG. 4B also shows cooling channels 416 disposed within the flaps 312, 314. The cooling channels 416 are coupled to a fluid source (not shown) to circulate fluid through the flaps 312, 314 during operation of the process chamber, the remote plasma source, or both, thus maintaining a desired temperature of the flaps 312, 314 during processing operations. A coupling of the cooling channels 416 to a fluid source for the passage of fluid inwardly and outwardly of the isolation device 300 is shown in FIG. 5 and described with respect thereto.

It is understood that other seal arrangements may be utilized. In FIG. 4A-4B, one seal is used for the outer seal 412 but a greater or lesser number of seals may be used (e.g., two seals may be used to surround the inner seals 414a, 414b). Similarly, a greater or lesser number of seals, such as one seal, may be used for the seals 414a, 414b (e.g., seals 414a, 414b may be replaced with a single seal that encircles the outlet ports 308a, 308b). O-rings within groves are shown in FIGS. 4A-4B. In certain embodiments, the grooves may be removed and a seal ring adhered directly to the face of the flap 312, 314. The O-rings may comprise a polymer material or a petroleum based material. The material of the O-rings is generally selected in relation to the processes associated with the process chamber to minimize deterioration of the O-rings. Other sealing mechanisms may be used herewith. For example, other seal cross-sections, such as ovoid, V shaped, etc., may also be used. Though not shown, it is contemplated that a second seal may be disposed in a second seal groove formed in a surface of the flap 312 opposite the surface retaining the outer seal 412. In this configuration, the second seal can be configured to seal against an interior surface of body 302 surrounding the inlet port 304 to further isolate the downstream process chambers from the remote plasma source.

As discussed above, in the closed position, the flap 314 contacts an interior surface 336 of the body 302 while the flap 312 does not contact an interior surface of the body 302. That is, a small gap exists between the flap 312 and the body 302, In one embodiment, the flap 314 maintains a small gap, such as in a range of 10 mm to 20 mm between the flap 314 and an interior surface of the body 302 at the first end 330 discussed with respect to FIG. 3A. In one embodiment, the flaps 312, 314 are electrically isolated from the body 302, In that embodiment, the flaps 312, 314 do not form a portion of a circuit, and thus an electrostatic field thereon is minimized or prevented and deposition of particles onto the flap surface is minimized.

The seals 412, 414a, 414b will degrade over time due to repeated exposure to process gases and the output of the remote plasma source. In order to maintain the sealing capabilities of the embodiments herein, the seals may be cleaned or replaced with identical seals during maintenance opportunities. The process chamber is shut down in order to perform required maintenance. The embodiments described herein advantageously minimize the maintenance downtime by allowing for rapid cleaning or replacement of the seals which are accessed by the removable maintenance door. Further, the remote plasma source does not require removal from the isolation device 300 to access the valve for maintenance thereby further reducing the maintenance downtime.

FIG. 5 is a schematic, partial cutaway of the isolation device 300. In FIG. 5, the removable door 502 is shown coupled to the body 302. The flaps 312, 314 are shown in the closed position. FIG. 5 shows flaps 312, 314 coupled to respective actuation assemblies 504a, 504b. The actuation assemblies 504a, 504b pivotally swing the flaps 312, 314 between the open and closed positions. The actuation assembly 504a and the flap 312 connected thereto, are shown in cross section.

The actuation assemblies 504a, 504b comprise shafts 506a, 506b which extend into the body 302 and are coupled to the flaps 312, 314 at one end. The actuators 316 are coupled to the shafts 506a, 506b at the ends thereof opposite the flaps 312, 314 and are configured to controllably rotate the shafts 506a, 506b, and thereby swing the flaps 312, 314 through an arc centered at the respective shaft 506a, 506b. The actuators 316 may be pneumatic, electric, or any configuration capable of rotating the shafts 506a, 506b. Bearings (not shown) are coupled to the shafts 506a, 506b within the housings 508a, 508b to enable rotation of the shafts 506a, 506b therein.

The shafts 506a, 506b extend through the housings 508a, 508b. The housings 508a, 508b comprise coolant inlets 512 coupled to inlet conduits 516 and outlet conduits 518 coupled to cooling outlets 514. The housings 508a, 508b function as cooling jackets around the shafts 506a, 506b. The coolant inlets 512 and the cooling outlets 514 are in fluid communication with cooling channels 416 disposed within flaps 312, 314 through a rotary union or other suitable mechanism. A coolant fluid is circulated through the cooling channels 416 in the flaps 312, 314 in order to maintain the flaps 312, 314 at a temperature within a range that maintains the material properties of the flaps 312, 314 and the seals disposed therein, for example, to reduce seal degradation. In the embodiment of FIG. 5, the cooling channels 416 are illustrated in a rectangular perimeter around the flap 312. Other geometries, such as circular, lattice, or grid-like, are contemplated. Any geometry capable of flowing a fluid within the flaps may be utilized.

The housings 508a, 508b are coupled at base plates 520a, 520b at the body 302 by fasteners 522, such as bolts. It is understood that any mechanism for coupling the housings 508a, 508b to base plates 520a, 520b, for example latches, bonding, brazing, or clamping may be employed. Seals 524 are disposed adjacent to the port 526. The port 526 is coupled to a vacuum pump or other source such as a Venturi in order to create a vacuum seal therein. Other methods of sealing are contemplated in order to prevent leakage of process fluid from the body 302 into the housings 508a, 508b and to prevent leakage of coolant from the housings 508a, 508b into the body 302.

The embodiments described herein advantageously isolate a remote plasma source from process chambers coupled thereto. The embodiments described herein allow a single isolation device to be used to isolate two chambers, thus reducing the size of the processing system. Further, the narrow size of the isolation device and the remote plasma source coupled thereto allow for process chamber lids to be removed for maintenance without removing the isolation device and the remote plasma source. Thus, the maintenance window is reduced and production of the chambers is increased. It is to be understood that the embodiments described herein are not limited to the exemplary process system. Any system wherein chambers require isolation from one another may benefit from the embodiments described herein.

While the foregoing is directed to embodiments of the present disclosure, other and further embodiments of the disclosure may be devised without departing from the basic scope thereof, and the scope thereof is determined by the claims that follow.

What is claimed is:

1. An isolation device, comprising:
a body having an inlet opening at a first end and one or more outlet openings at a second end;
an isolation volume defined in the body between the first end and the second end;
a first flap disposed within the isolation volume and configured to be pivoted to selectively allow access to and block access to the inlet opening; and
a second flap disposed within the isolation volume, and configured to be pivoted to selectively allow access to and block access to the one or more outlet openings, wherein a first seal is disposed in the first flap and at least one second seal is disposed within the second flap, such that the first seal surrounds the at least one second seal when in an open position and the at least one second seal surrounds the one or more outlet openings when the second flap is positioned to block access to the one or more outlet openings.

2. The isolation device of claim 1, wherein the first flap and the second flap are positioned face-to-face when in the first flap and the second flap are positioned to allow access to the inlet opening and the outlet openings.

3. The isolation device of claim 1, wherein the body, the first flap, and the second flap include cooling channels formed therein.

4. The isolation device of claim 1, further comprising a pressure relief system coupled to the isolation volume.

5. The isolation device of claim 1, wherein the body, the first flap, and the second flap comprise a metal containing material.

6. The isolation device of claim 5, wherein the metal containing material comprises aluminum.

7. The isolation device of claim 1, wherein the first flap and the second flap are coupled to rotary shafts.

8. A system for processing a substrate, comprising:
a remote plasma source;
one or more process chambers fluidly coupled to the remote plasma source; and
an isolation device disposed between the remote plasma source and the one or more process chambers, the isolation device comprising:
a body having an inlet opening and at least one outlet opening;
an isolation volume defined in the body;
a first flap disposed within the isolation volume and comprising a first seal disposed in the first flap; and
a second flap disposed within the isolation volume and comprising at least one second seal disposed in the second flap, wherein the first seal surrounds the at least one second seal and the at least one second seal surrounds the at least one outlet opening when the second flap is positioned to prevent access to the at least one outlet opening.

9. The system of claim 8, wherein the at least one second seal comprises two seals, each of the two seals configured to surround one of the at least one outlet openings.

10. The system of claim 8, wherein the first flap and the second flap are positioned face-to-face when the first flap and the second flap are positioned to allow access to the inlet opening and the at least one outlet opening.

11. The system of claim 8, wherein the one or more process chambers comprises a plurality of process chambers, and each of the at least one outlet openings correspond to a respective process chamber of the plurality of process chambers.

12. The system of claim 8, wherein the first flap and the second flap are coupled to rotary shafts.

13. The system of claim 12, and wherein the body, the first flap, and the second flap comprise a metal containing material.

14. The system of claim 13, wherein the metal containing material comprises aluminum.

15. The system of claim 8, where in the isolation device further comprises a pressure relief system coupled to the isolation volume.

16. The system of claim 8, wherein the at least one outlet opening comprises two outlet openings and the one or more process chambers comprises two process chambers.

17. The system of claim 16, wherein the inlet opening is in fluid communication with the remote plasma source and the two outlet openings are each in fluid communication with one of the two process chambers.

18. A method for processing a substrate comprising:
blocking fluid communication between a remote plasma source and a process chamber with an isolation device, the blocking comprising:
moving a first flap having a first seal about a first axis within an isolation volume of the isolation device from a first position in which the first flap blocks access to a first port disposed in a first end of the isolation device to an open position; and
moving a second flap having at least one second seal about a second axis within the isolation volume of the isolation device from a second position to the open position, wherein:
while in the open position the first seal surrounds the at least one second seal and forms a seal around the at least one second seal; and
while the second flap is in the second position the second flap blocks access to outlet ports disposed in a second end of the isolation device, such that the at least one second seal surrounds the outlet ports.

* * * * *